United States Patent [19]
Coker et al.

[11] Patent Number: 5,258,952
[45] Date of Patent: Nov. 2, 1993

[54] SEMICONDUCTOR MEMORY WITH SEPARATE TIME-OUT CONTROL FOR READ AND WRITE OPERATIONS

[75] Inventors: Thomas A. Coker, Irving; David C. McClure, Carrollton, both of Tex.

[73] Assignee: SGS-Thomson Microelectronics, Inc., Carrollton, Tex.

[21] Appl. No.: 627,236

[22] Filed: Dec. 14, 1990

[51] Int. Cl.$^5$ ............................................. G11C 7/00
[52] U.S. Cl. ...................................... 365/194; 365/233
[58] Field of Search ............... 365/194, 233, 233.05, 365/189.05

[56] References Cited
U.S. PATENT DOCUMENTS

| | | | |
|---|---|---|---|
| 4,580,246 | 4/1986 | Sibigtroth | 365/194 |
| 4,916,668 | 4/1990 | Matsui | 365/233 |
| 5,031,141 | 7/1991 | Guddat | 365/233 |
| 5,031,150 | 7/1991 | Ohsawa | 365/194 |
| 5,083,296 | 1/1992 | Hara | 365/233 |
| 5,091,889 | 2/1992 | Hamano | 365/233 |
| 5,124,584 | 6/1992 | McClure | 307/480 |
| 5,124,951 | 6/1992 | Slemmer | 365/227 |
| 5,126,975 | 6/1992 | Handy | 365/233 |
| 5,128,897 | 7/1992 | McClure | 365/230.06 |

Primary Examiner—Eugene R. LaRoche
Assistant Examiner—A. Zarabian
Attorney, Agent, or Firm—Rodney M. Anderson; Lisa K. Jorgenson; Richard K. Robinson

[57] ABSTRACT

A read/write memory having timed-out control of certain of its peripheral circuitry is disclosed. The control circuit for controlling the time at which time-out is to occur includes two delay stages of different lengths. The shorter delay stage is used to define the time-out in a read operation, and the longer delay stage is used to define the time-out in a write operation, since a read operation can generally be accomplished sooner than a write operation. Enabling of the periphery is controlled by an address transition detection circuit, and by a data transition detection circuit. The circuit includes a short path by which enabling of the periphery is performed responsive to a data transition in the absence of an address transition, in order to perform a late write operation.

20 Claims, 4 Drawing Sheets

SEMICONDUCTOR MEMORY WITH SEPARATE TIME-OUT CONTROL FOR READ AND WRITE OPERATIONS

This invention is in the field of semiconductor memory circuits, and is particularly directed to the timing and control of such circuits.

BACKGROUND OF THE INVENTION

Many conventional memories, such as random access memories (RAMs) and read-only memories (ROMs) of various types (including ROMs, PROMs, EPROMs, and EEPROMs), are intended to operate in a static mode, where presentation of an address to the memory accesses the desired memory location, without requiring a clock signal. For most static memories, no maximum cycle time is specified (in contrast to dynamic memories such as dynamic RAMs), so that the memory must respond whenever a change in address is presented. One way in which such operation is achieved is by providing a "fully" static memory, where all circuitry within the memory is operating so long as the chip is enabled; for example, the addresses may be statically decoded, so that the value at the address pins is continually being decoded.

In modern computing systems which use such memories, however, power dissipation of the memories is of concern. Fully static memories, since all circuitry internal is operating at all times, thus dissipate significantly more power than a similarly sized dynamic memory. Accordingly, many conventional static memories have low-power modes, such as standby modes, where the contents of the memory are maintained but where the peripheral circuitry is disabled, saving significant power.

One conventional way in which some static memories enter such a low-power mode is through the use of "time-out" circuitry, usually in combination with an address or input transition detection circuit. A time-out circuit within such memories disables certain peripheral functions within the memory after a time period has elapsed since the beginning of the prior memory operation; the address transition detection circuit remains enabled, generates an internal signal upon detection of a change of address (i.e., a new memory cycle is being enabled), and re-enables the memory.

Figure 1:
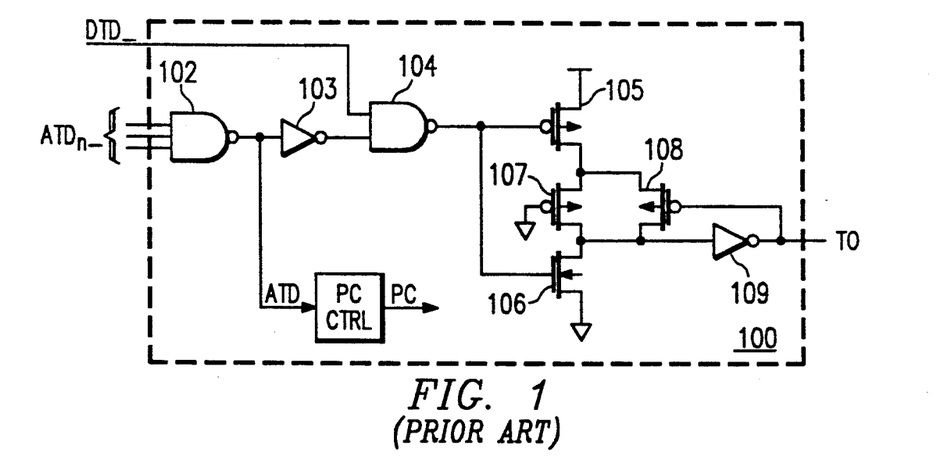
FIG. 1 is an electrical diagram, in schematic form, of a conventional time-out control circuit for a memory.

Referring to FIG. 1, a conventional time-out circuit 100 as used in static RAM devices is illustrated. Time-out circuit 100 receives inputs on lines $ATD_{n\_}$ from a number of address transition detection circuits (not shown), and on line $DTD\_$ from a data transition detection circuit (also not shown); the inputs on lines $ATD_{n\_}$ are summed by NAND gate 102 and inverted by inverter 103, and presented to one input of NAND gate 104, which also receives line $DTD\_$ at an input. The output of NAND gate 104 is connected to a push-pull driver including p-channel transistor 105, p-channel transistor 107, and n-channel transistors 106 having their source-drain paths connected in series between V and ground. The gates of transistors 105 and 107 receive the output of NAND gate 104, and p-channel transistor 107 has its gate tied to ground, serving as a resistive element as will be shown hereinbelow. The drains of transistors 106 and 107 are connected to the input of inverter 109, which drives line TO at its output; a latching p-channel transistor is connected between the drain of transistors 105 and the input of inverter 109, and has its gate connected to the output of inverter 109. It should be noted that this conventional circuit also can communicate the presence of an address transition to other portions of the memory, as suggested by the precharge control circuit 110 receiving the output of NAND gate 102, and presenting a precharge signal on line PC responsive thereto.

In operation, beginning in the disabled condition, all lines $ATD_{n\_}$ and $DTD\_$ are high, which sets the output of NAND gate 104 to a low logic level, pulling high the input of inverter 109 through transistors 105 and 107, and setting line TO low. In this condition, line TO is indicating to the remainder of the memory within which circuit 100 is incorporated that certain of the peripheral circuits can be disabled, such as decoders, sense amplifiers, write drivers and the like; in such a condition, certain circuits remain activated, however, examples of which include output drivers, and possibly equilibration and precharge devices for the bit lines of the memory. Upon the initiation of a memory operation, one or more of lines $ATD_{n\_}$ and line $DTD\_$ go to a low logic level, causing the output of NAND gate 104 to go to a high logic level. This causes transistor 106 to turn on, pulling the input of inverter 109 low, and issuing a high level on line TO. Since the transition detection circuits issue pulses upon detection of a transition, upon completion of the pulses the output of NAND gate 104 returns to a low logic level, turning on transistor 105 and turning off transistors 106. Due to the resistance presented by transistor 107, however, inverter 109 will not see a high logic level at its input until a certain delay time after the transition detection pulses have ended. Upon the expiration of this delay time, the input of inverter 109 will be pulled high, causing line TO to return to a low logic level, communicating the time-out state, to the remainder of the memory.

Selection of the time delay for time-out circuit 100, or other conventional time-out circuits, determines the amount of power savings achieved in the memory. It is of course essential that the time-out delay from the beginning of the cycle be sufficiently long that completion of the desired operations occur; premature time-out would result in the reading or writing of incorrect data. It is also desirable, however, that the time-out of the memory occur as soon as possible after the completion of the operation, as this would result in the greatest average power savings.

However, different types of cycles require different time periods to perform their operation, prior to timing out. For example, a write operation generally takes longer than a read operation in many modern memories. Accordingly, since the time-out cannot occur until such time as a write operation is complete, conventional memories have selected the time-out time based on the worst case operation. As a result, the selected worst case time-out delay period results in unnecessary dissipation of power in read operations.

It is therefore an object of this invention to provide a memory where the time-out delay period is optimized for each type of memory cycle.

It is a further object of this invention to provide a time-out circuit for a memory which times out earlier in a read cycle than in a write cycle.

It is a further object of this invention to provide such a circuit having separately established time-out delays for read operations than for write operations.

It is a further object of this invention to allow for fast enabling of the periphery after a timed-out write operation, responsive to a data transition.

Other objects and advantages will be apparent to those of ordinary skill in the art having reference to the following specification together with the drawings.

SUMMARY OF THE INVENTION

The invention may be incorporated into a time-out control circuit, where first and second delay paths are used in the generation of the time-out signal. Circuitry is included which selects between the first and second delay paths, depending upon whether a read or a write operation is being performed, such that a read operation times out earlier than a write operation. Significant reduction in power can result, without risking upset of either operation.

DETAILED DESCRIPTION OF THE PREFERRED EMBODIMENTS

Figure 2:
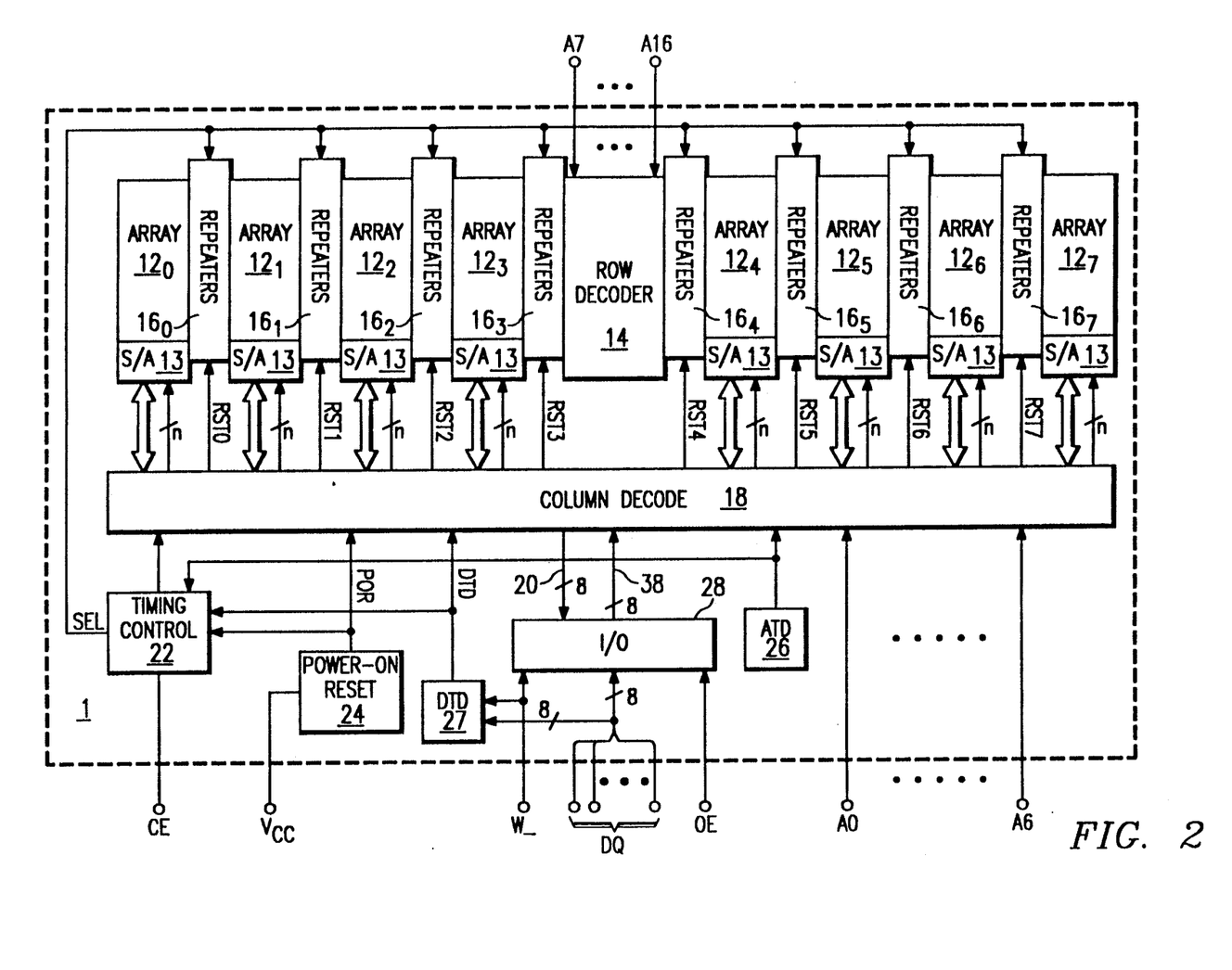
FIG. 2 is an electrical diagram, in block form, of a static memory incorporating the preferred embodiment of the invention.

Referring now to FIG. 2, a block diagram of an integrated circuit memory 1 incorporating the preferred embodiment of the invention described herein will be described. Memory 1 is an integrated circuit memory, for example a static random access memory (SRAM), having $2^{20}$, or 1,048,576, storage locations or bits. Memory 1 in this example is a wide-word memory, organized as $2^{17}$, or 128 k, addressable locations of eight bits each. Accordingly, for example in a read operation, upon the access of one of the memory locations, eight data bits will appear at the eight input/output terminals DQ. The electrical organization of memory 1, in this example, is 1024 rows of 1024 columns, with eight columns accessed in each normal memory operation.

In this example of memory 1, the memory array is divided into eight sub-arrays $12_0$ through $12_7$, each of which have 1024 rows and 128 columns. Memory 1 includes seventeen address terminals A0 through A16, for receiving the seventeen address bits required to specify a unique memory address. In the conventional manner, the signals from these seventeen address terminals are buffered by address buffers (not shown). After such buffering, signals corresponding to ten of the address terminals (A7 through A16) are received by row decoder 14, for selecting the one of the 1024 rows to be energized by row decoder 14.

FIG. 2 illustrates schematically the relative physical location of sub-arrays 12 relative to one another, and relative to row decoder 14. As will be described in further detail hereinbelow, the selection of a row of memory cells in sub-arrays 12 is accomplished by row lines, one of which is driven from row decoder 14 according to the value of the row address at terminals A7 through A16. In an arrangement such as shown in FIG. 2 where row decoder 14 is located centrally, with sub-arrays 12 on either side thereof, it is preferred that the most significant column address bit (address terminal A6 in this embodiment) also be decoded by row decoder 14, so that the row line may be energized only on one side of the centrally located row decoder 14, according to this most significant column address bit. The energizing of a row line connects the contents of memory cells to their corresponding bit lines in the conventional manner. Sense/write circuits 13 are provided for sensing and storing the data state on the bit lines in sub-arrays 12, for communicating externally presented input data to the selected memory cells. It should be noted that many conventional arrangements and organization of sense/write circuits 13 may be utilized in memory 1 according to the invention, such arrangements including the assignment of one sense amplifier for each bit line pair, or the assignment of one sense amplifier for multiple bit line pairs, with the selection of which bit line pair is to be sensed made by column decoder 18 according to the column address. In addition, separate write paths and write circuits may also be provided.

For purposes of reducing the power consumed during active operation, in this embodiment only one of the sub-arrays 12 remains energized during each active cycle, with the selection of the sub-array 12 which remains energized determined by the desired memory address (i.e., three bits of the column address). This is done by repeaters 16, which are provided between sub-arrays 12, and also between row decoder 14 and sub-arrays $12_3$ and $12_4$. Repeaters 14 pass along the energized state of the selected row line, latch the energized state of the selected row line for the selected sub-array 12, and de-energize the row line for sub-arrays 12 which are not selected. This arrangement requires that all eight bits of the accessed memory location are located in the same sub-array 12.

It should be noted that, for purposes of this invention, it is not essential or necessary that the eight bits of the accessed memory location must be located in the same sub-array 12, or that latched repeaters 16 be provided between sub-arrays 12. As described in copending application Ser. No. 588,577 filed Sep. 26, 1990 and assigned to SGS-Thomson Microelectronics, Inc., however, such organization is preferred as it provides for reduced active power dissipation without the disadvantages attendant with time-out of the word lines or of multiple metal level implementations.

Signals corresponding to the remaining seven address terminals (A0 through A6) are received by column decoder 18 to control repeaters 14 to maintain selection of one of sub-arrays 12 by way of lines RST0 through RST7. Column decoder 18 also selects the desired columns in the selected sub-array 12 responsive to the remainder of the column address value, in the conventional manner. While single lines are indicated for the communication of the address value to row decoder 14 and column decoder 18, it should be noted that, as in many conventional memories, both true and complement values of each address bit may alternatively be communicated from the address buffers to the decoders, for ease of decoding.

Further included in memory 1 according to this embodiment of the invention, is input/output circuitry 28, which is in communication with column decoder 18 via an eight-bit output bus 20 and an eight-bit input bus 38, and which is also in communication with input/output terminals DQ, with write enable terminal W—, and with output enable terminal OE. Input/output circuitry 28 includes conventional circuitry for providing and controlling communication between input/output terminals DQ and the memory cells selected according to the address value presented to memory 1, and accordingly will not be described in further detail herein. It should be noted that many other alternative organizations of memory 1, relative to the input/output width, and including dedicated rather than common input/output terminals, may also utilize the present invention.

Memory 1 further includes timing control circuitry 22, which controls the operation of various portions of memory 1 during a memory cycle in the conventional manner. It should be noted that timing control circuitry 22 is generally not a particular block of circuitry, as suggested by FIG. 2, but generally is distributed within memory 1 to control the operation of various portions therein. Timing control circuitry 22 receives, for example, signals from terminal CE which enables and disables the operation of memory 1. As shown in FIG. 2, line SEL from timing control circuitry 22 is connected to repeaters 16, for control thereof as described in said copending application Ser. No. 588,577.

It should also be noted that, for some static memories, timing control circuitry 22, and other circuit blocks such as column decoder, respond according to a address transition detection circuit 26 to control the operation of memory 1 dynamically, in response to transitions at address terminals A0 through A16. Copending application Ser. No. 601,287, filed Oct. 22, 1990 and assigned to SGS-Thomson Microelectronics, Inc., incorporated herein by this reference, describes an address transition detection circuit as may be used as address transition detection circuit 24, and its application to the buffering of the address signals received at address terminals A0 through A16. It should be noted that such control according to address transition detection is preferred in this embodiment of the invention to control the precharge and equilibration of the bit lines as will be described hereinbelow. It should also be noted that use of address transition detection to control repeaters 16 performed dynamically within a cycle, as described in said copending application Ser. No. 588,577, is also preferred.

In addition to address transition detection circuit 26, memory includes data transition detection (DTD) circuit 27. DTD circuit 27 has inputs connected to each of the input/output terminals DQ, and has a control input connected to the write enable terminal W—. The output of DTD circuit 27 is communicated to column decoder 18, and also to timing and control circuit 22, as will be shown hereinbelow. DTD circuit 27 is constructed similarly as ATD circuit 26, and provides a pulse at its output on line DTD responsive to detection of a transition at any of input/output terminals DQ during a write operation (indicated to DTD circuit 27 by terminal W—).

Memory 1 further includes a power-on reset circuit 24. Power-on reset circuit 24 receives bias voltage from power supply terminal $V_{cc}$ (as of course do other portions of memory 1 by connections not shown), and generates a signal on line POR indicating that the $V_{cc}$ power supply has reached a sufficient level upon memory 1 initially powering up, to prevent portions of memory 1 from powering-up in an indeterminate, or undesired, state. As will be described hereinbelow, and as described in copending application Ser. No. 569,000, filed Aug. 17, 1990, incorporated herein by this reference, said application assigned to SGS-Thomson Microelectronics, Inc., power-on reset circuit 24 may similarly also control other portions of memory 1, as suggested by the connection of line POR to timing control circuitry 22 in FIG. 2. Said copending application Ser. No. 569,000 also describes preferred configurations of power-on reset circuit 24, although for purposes of this invention conventional power-on reset circuits may also be used.

As noted above, for purposes of reducing power consumption, memory 1 according to this embodiment energizes only one of the eight sub-arrays 12, selected according to the three most significant column address bits. In this embodiment, repeaters 16 are present between sub-arrays 12, and also between row decoder 14 and each of sub-arrays $12_3$ and $12_4$, for maintaining the application of the energized row line within the selected sub-array 12 and, after a period of time, de-energizing the row line in the other sub-arrays 12. In this way, the column address (particularly the three most significant bits) controls the application of the word line so that only that portion of the word line in the selected sub-array 12 is energized for the entire memory operation cycle. Column decoder 18 also selects eight of the 128 columns in the selected sub-array 12, according to the value of the remaining bits of the column address. In this embodiment, also for purposes of reducing active power consumption, only those sense/write circuits 13 in the selected sub-array 12 which are associated with the desired memory bits are energized. Sense/write circuits 13 so selected by column decoder 18 are then placed in communication with input/output circuitry 28 via bus 20 or bus 38, as the case may be, through which the reading of data from or writing of data to the selected memory cells may be done in the conventional manner. Said copending application Ser. No. 588,577, incorporated herein by this reference, provides a detailed description of the construction and operation of repeaters 16.

Of course, many alternative organizations of memory 1 may be used in conjunction with the invention described herein. Examples of such organizations would include by-one memories, where a single bit is input to or output from in normal operation. In addition, wide-word memories where each sub-array is associated with one of the input/output terminals, and memories where the entire array is energized during normal operation, may alternatively be used. As mentioned hereinabove, of course, other memory types such as dynamic RAMs, EPROMs, embedded memories, dual-port RAMs, FIFOs, and the like, each with organization of their own, may also benefit from this invention.

It should also be noted that other physical an electrical arrangements of the sub-arrays 12 may be alternatively be used with the present invention. For example, two row decoders 14 may be incorporated into memory 1, each of which controls the application of a row line signal into half of the memory. Row decoder or decoders 14 may also be located along one edge of its associated sub-arrays 12, rather than in the middle thereof as shown in FIG. 2. It is contemplated that the particular layout of memory 1 will be determined by one of ordinary skill in the art according to the particular parameters of interest for the specific memory design and manufacturing processes.

Figure 3:
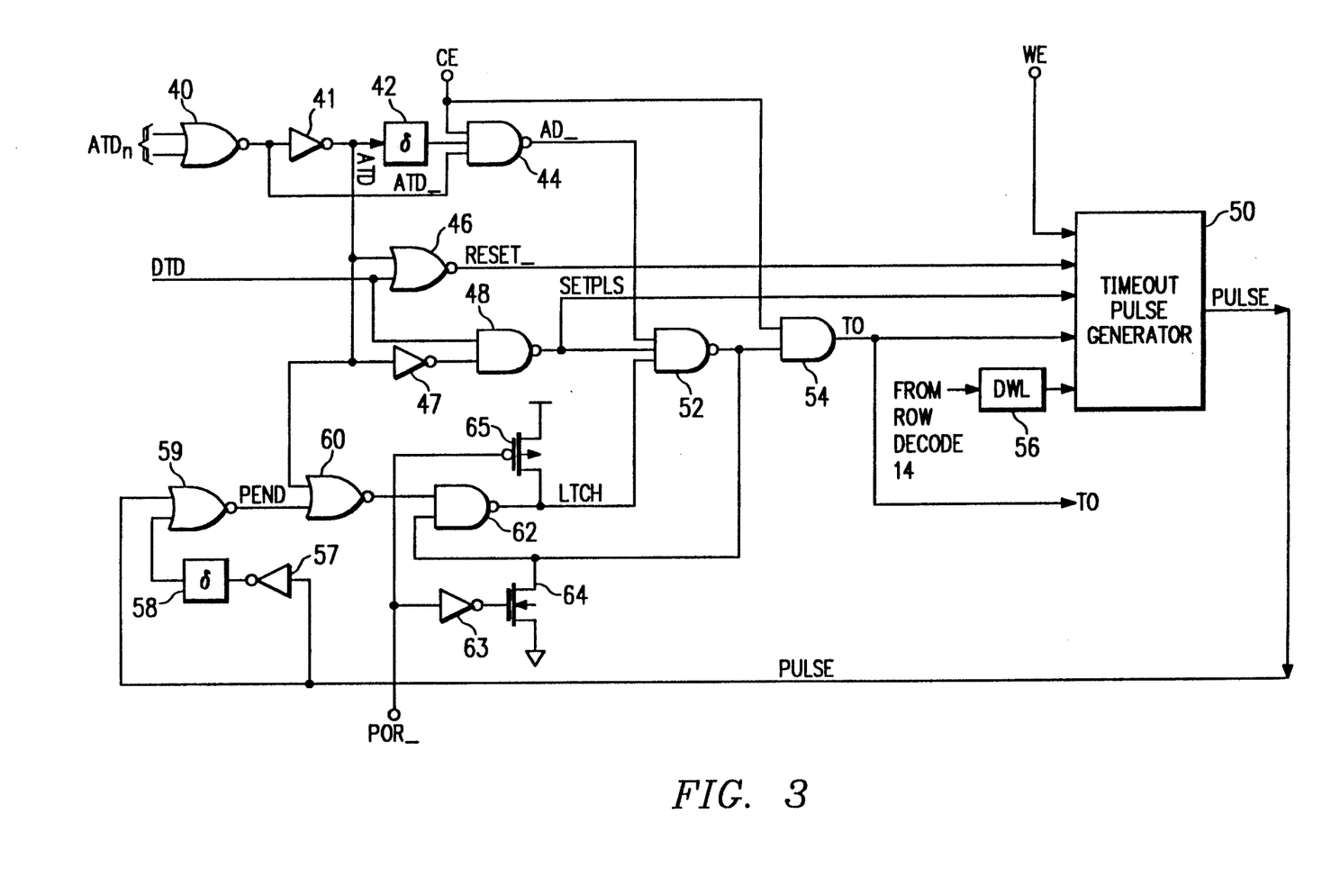
FIG. 3 is an electrical diagram, in schematic form, of a time-out control circuit according to the preferred embodiment of the invention.

Referring now to FIG. 3, a portion of timing control circuit 22 which controls the time-out of memory 1 will now be described in detail. Lines $ATD_n$, each indicating a transition associated with one of the address inputs A0 through A16, are communicated to the inputs of NOR function 40; the output of NOR 40, on line ATD_, is communicated to one input of NAND gate 44, and to inverter 41. The output of inverter 41 is line ATD, which is communicated, via a delay stage 42, to another input of NAND gate 44, and also to NOR gate 46. Lines ATD and ATD_ thus communicate a pulse responsive to the detection of a transition at one or more of the address terminals; while not shown, lines ATD and ATD_ may be communicated elsewhere within memory 1 to such functions which are to be enabled responsive to such transitions. The third input to NAND gate 44 is from chip enable terminal CE, which enables memory 1 when receiving a high logic state. The output of NAND gate 44, on line AD_, communicates a pulse to the remainder of the time-out control in timing control circuit 22, as will be described in further detail hereinbelow.

Line DTD is received from data transition detection circuit 27, and is connected to another input of NOR gate 46, and to an input of NAND gate 48. The output of NOR gate 46, which performs the NOR of line ATD and line DTD, is communicated on line RESET_ to timeout pulse generator circuit 50, the construction and operation of which will be described in further detail hereinbelow.

The other input of NAND gate 48 receives line ATD, after inversion by inverter 47. NAND gate 48, at its output, controls line SETPLS, which is communicated to an input of NAND gate 52, and also to timeout pulse generator 50. The function of line SETPLS is to allow for the rapid enabling of memory 1, and the start of a new time-out period, in the event of a data transition during a long write cycle, after time-out after the address transition has already occurred. Such rapid enabling of memory 1 is important in performing the write operation within a short period of time from the transition of data in a long write operation, as is generally specified for static memories, without requiring that memory 1 be enabled throughout the entire long write cycle.

NAND gate 52 receives line LTCH from NAND gate 62 at its third input, and has its output connected to an input of NAND gate 62, so that a latch is formed by cross-coupled NAND gates 52 and 62. The output of NAND gate 52 is also connected to an input of AND gate 54, which receives chip enable line CE at its other input. The output of AND gate 54 is line TO, which is communicated to timeout pulse generator 50. Line TO is also communicated to various circuits within memory 1, and controls the enabling and disabling of these circuits according to the time duration after the beginning of the cycle and, according to this invention, depending upon whether or not a write or a read operation is being performed. As will be apparent hereinbelow, the duration of the pulse of line TO (which enables active operation when at a high logic level) is controlled by timeout pulse generator 50, which has its output on line PULSE coupled to the latch of NAND gates 52 and 62.

It should be noted that particular functions which are to be disabled after the time-out period has elapsed include such circuits as row decoder 14, column decoder 18, sense amplifiers 13, repeaters 16, and the like. It should also be noted that certain functions are preferably performed in memory 1 during the period which the other active circuits are disabled; examples of these functions include output drivers in input/output circuit 28, ATD circuit 26 and DTD circuit 27, and the precharge and equilibration of bit lines in sub-arrays 12.

Timeout pulse generator circuit 50 also receives an input on line DWL from a dummy word line 56, which in turn is enabled by row decoder 14. Dummy word line 56 consists of either a resistor-capacitor circuit which matches a word line in memory 1, or may alternatively (and preferably) be an actual word line which is not functional to connect memory cells to the bit lines in memory 1, but which accurately emulates the operation of an operative word line. Dummy word line 56 thus is useful to indicate a delay period from the enabling of a word line by row decoder 14, such that upon line DWL going to a high logic level, it is assured that the selected word line in memory has been fully enabled by row decoder 14 (and repeaters 16, as the case may be). It is further preferable to add some additional delay to the actual dummy word line 56 for purposes of safety.

Figure 4:
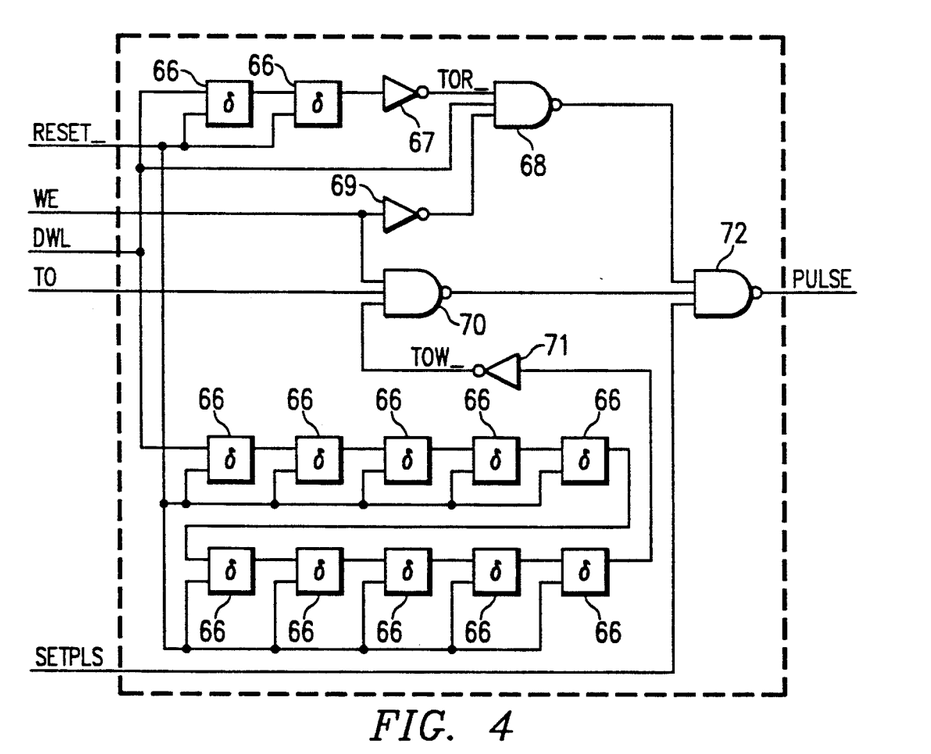
FIG. 4 is an electrical diagram, in schematic form, of the time-out pulse generator in the circuit of FIG. 3.

Referring now to FIG. 4, the construction of timeout pulse generator 50 will now be described. As noted hereinabove, timeout pulse generator 50 receives inputs on lines RESET_, DWL, TO, and SETPLS. In addition, according to this embodiment of the invention, timeout pulse generator 50 receives an input on line WE, coupled from the similarly named terminal, which indicates with a high logic level that a write operation is to be performed, and which indicates with a low logic level that a read operation is to be performed. As will be evident hereinbelow, the length of the timeout period depends upon which operation is selected, according to this embodiment of the invention.

Line DWL is received at an input of two delay gates 66, each of these two delay gates 66 being the first in a chain thereof. In each of the chains of delay gates 66, the chain is constructed by connection of the output of a prior delay gate 66 to an input of the next, with line RESET_ connected to the second input of each delay gate 66. The shorter of the two chains of delay gates 66, in this embodiment including two delay gates 66, will be referred to as the "read" delay chain; the longer of the two chains will be referred to as the "write" delay chain hereinbelow.

Figure 5:
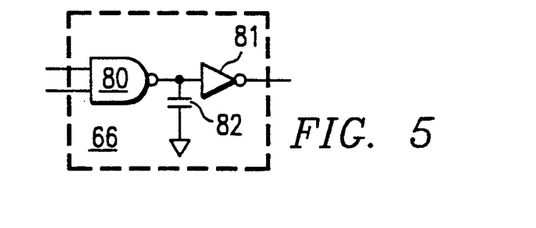
FIG. 5 is an electrical diagram, in schematic form, of a delay element in the circuit of FIG. 4.

Referring to FIG. 5, the construction of each delay gate 66 is shown. NAND gate 80 receives the two inputs on line RESET_ and either line DWL (for the first delay gates 66 in each chain) or output of the prior delay gate 66 (for those delay gates 66 in each chain other than the first one). The output of NAND gate 80 is connected to the input of inverter 81, and is loaded with a capacitor 82, so that the response of NAND gate 80 is slowed by the capacitive loading of capacitor 82. The output of inverter 81 is the output of the delay gate 66, so that each delay gate 66 is the delayed AND of its two inputs. In this embodiment of the invention, the delay through a single delay gate 66 is on the order of 2.5 nsec.

Referring back to FIG. 4, line WE is received at an input of NAND gate 70 and, after inversion by inverter 69, at an input of NAND gate 68. NAND 68 receives, at its other inputs, line DWL and line TOR_, which is the output of the last of delay gates 66 in the read chain after inversion by inverter 67. NAND gate 70 receives line TOW_ at an input, which is the output of the last of the ten delay gates 66 in the write chain, inverted by inverter 71. NAND gate 70 also receives line TO at an input. The outputs of NAND gates 68 and 70, as well as line SETPLS, are connected to inputs of NAND gate 72, which generates line PULSE at its output. As will be noted hereinbelow, the duration of line PULSE will determine the duration of the pulse on line TO in this embodiment of the invention, and hence the length of time in a cycle until portions of memory 1 are disabled.

Referring back to FIG. 3, line PULSE is connected to a first input of NOR gate 59, and also to a second input of NOR gate 59 after inversion by inverter 57 and a delay by delay gate 58. As will be more evident hereinbelow, NOR gate 59 thus issues a positive pulse for a brief period after the end of a pulse on line PULSE from timeout pulse generator 50. The output of NOR gate 59 is connected to an input of NOR gate 60, which has its input connected to an input of NAND gate 62. As noted hereinabove, NAND gate 62 drives line LTCH, which is connected to NAND gate 52. Accordingly, line PULSE is coupled to the latch of NAND gates 52 and 62, and thus controls the duration of the pulse on line TO as will be described hereinbelow.

Line POR_ from power-on reset circuit 24 is used in the circuit of FIG. 3 to ensure that, upon power-up, memory 1 is placed in a disabled state, awaiting an address transition. Line POR_ is connected to the gate of p-channel transistor 65 which has its source-drain path connected between line LTCH and V$_{cc}$; line POR is also connected, after inversion by inverter 63, to the gate of an n-channel transistor 64 which has its source-drain path connected between the output of NAND gate 52 and ground. Accordingly, since during power-up line POR_ is at a low logic level, and after power-up line POR_ is at a high logic level, the powering up of memory 1 will set line LTCH to a high logic level and set the feedback input of NAND gate 62 at a low logic level (to ensure that line LTCH stays high upon completion of power-up). This ensures that memory 1 powers up in a disabled, or timed-out, state.

Figure 6:
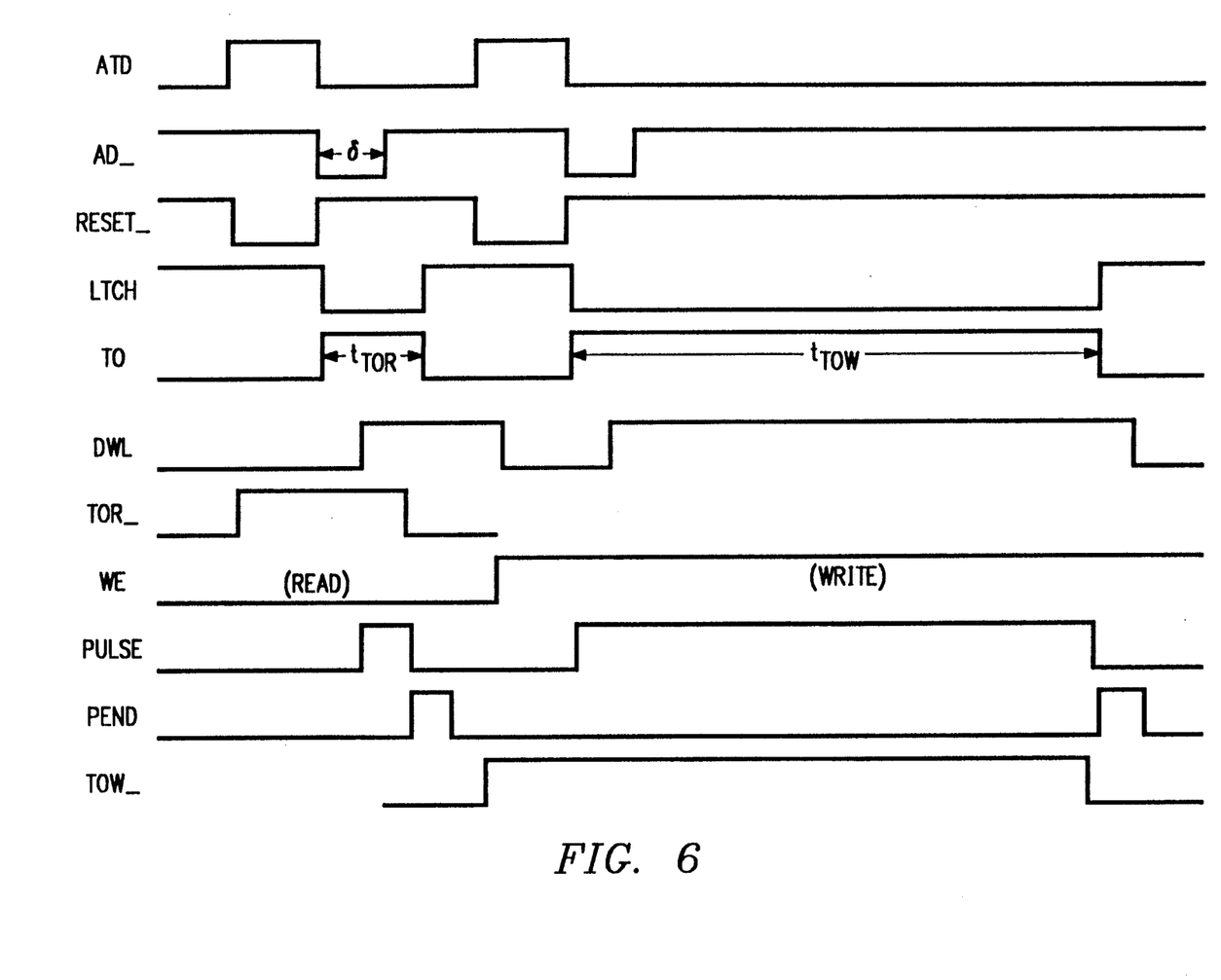
FIG. 6 is a timing diagram illustrating the operation of the circuit of FIGS. 3 and 4 in read and write operations.

Referring now to the timing diagram of FIG. 6, in conjunction with FIGS. 3, 4 and 5, the operation of the time-out control portion of timing control circuitry 22 in memory 1 will now be described. In this example, a read operation will be followed by a write operation, so that the different time-out periods, and their generation, will be apparent.

Prior to the initiation of the read operation in this example, the initial condition of memory 1 is such that all lines ATD$_n$ and DTD are at a low logic level (for purposes of these examples, line DTD will remain low, as the time-out will be controlled by line ATD only; accordingly, line SETPLS will remain high throughout this example). As a result, line AD_ at the output of NAND gate 44 is a high logic level, as is line RESET_. In this initial condition, memory 1 is timed-out, as indicated by line TO being at a low logic level. Accordingly, row decoder 14 is disabled, leaving line DWL at a low logic level. Also, line WE is at a low logic level (and will remain so for the first cycle of FIG. 6), indicating selection of a read operation.

Upon commencement of the cycle with an address transition, line ATD presents a high pulse, and line ATD_ presents a low pulse (not shown in FIG. 6). Responsive to line ATD going high, the output of NOR gate 46 will go to a low logic level, driving line RESET_ low. Responsive to line RESET_ going low, all of delay gates 66 in timeout pulse generator 50 are quickly reset, each presenting a low logic level at its output, such that line TOR_, shown in FIG. 4, is at a high logic level.

With line CE at a high logic level, the low logic level pulse on line ATD_ is communicated to NAND gate 44, so that line AD_ remains at a high logic level even though the high pulse of line ATD is later communicated via delay stage 42 to another input of NAND gate 44. Upon completion of the ATD pulse, at which time line ATD_ returns high, NAND gate 44 will present a low logic level on line AD_ for so long as it takes for the falling edge of the pulse on line ATD to propagate through delay stage 42. Accordingly, line AD_ presents a low pulse upon completion of the pulse on line ATD responsive to an address transition. This allows certain functions in memory 1 to be performed prior to the activation of the timed-out enable signal TO, as these functions can be initiated directly by the ATD pulse.

The low level pulse on line AD_ is communicated to NAND gate 52. Since line LTCH is initially high, and since line SETPLS is high (even if a data transition occurs during the address transition), NAND gate 52 will respond to the pulse on line AD_, so that the output of NAND gate 52 will go to a high logic level, as will line TO at the output of AND gate 54. The high logic level at the output of NAND gate 52 is communicated to the input of NAND gate 62 which (since its other input from NOR gate 60 is high due to line ATD returning low and line PULSE being low for some time) drives line LTCH to a low logic level; line LTCH thus maintains line TO at a high logic level.

As noted above, line TO serves to enable and control certain functions in memory 1. Examples of these functions include row decoder 14, repeaters 16, sense amplifiers 13, column decoder 18, and the like. As such, memory 1 is fully enabled for so long as line TO is at a high logic level; the duration of the high level at line TO depends upon the cycle being performed, as will be now described.

The high logic level on line TO is communicated to timeout pulse generator 50, as shown in FIG. 4. The rising edge of line TO initiates the selection of a word line according to the row address, which causes line DWL to go to a high logic level after the desired delay has elapsed. Also at this time, since the rising edge of line RESET_, line TOR_ has been at a high logic level. The low-to-high transition of line DWL causes NAND gate 68 to present a low logic level at its output during the read operation, which causes a high logic level to be generated by NAND gate 72 on line PULSE. Since write enable line WE is at a low logic level (in this read operation), NAND gate 70 will unconditionally present a high logic level, disabling the effect of the write chain of delay gates 66 in this read operation.

The rising edge of line DWL is also communicated through the read chain of delay gates 66, and ripples through to inverter 67 which causes line TOR_ to make a high-to-low transition. Lines WE (after inversion by inverter 69) and DWL enable NAND gate 68 to respond to line TOR_. The falling edge of line TOR thus presents a high logic level at the output of NAND gate 68 which, since the output of NAND gate 70 and line SETPLS remain high, causes the output of NAND gate 72, and thus line PULSE, to return to a low logic level, which will begin generation of the time-out of line TO.

Line PULSE is communicated to NOR gate 59 directly, and after inversion and delay; as a result, line PEND at the output of NOR gate 59 is a short pulse (for the duration of the delay stage 58) beginning at the end of the high level pulse of line PULSE. The high level on line PEND resets the latch by causing NOR gate 60 to present a low logic level to NAND gate 62, which sets line LTCH high and causes NAND gate 52 to end the pulse on line TO. This disables the circuits such as decoders, sense amplifiers, and the like noted hereinabove.

As a result, the duration of the pulse on line TO depends upon the delay of delay gates 66 in the read chain of timeout pulse generator 50. As is evident from FIG. 4, this delay chain is relatively short; this is because the read operation of memory 1, particularly with dynamic sense amplifiers 13, does not require a long active period. Accordingly, when the write enable line WE indicates that a read operation is occurring, the time-out according to this embodiment of the invention takes advantage of the type of cycle, rapidly disabling peripheral circuits in memory 1. The savings of power dissipation are thus maximized for a read operation.

Referring again to FIG. 6, the next cycle is a write operation, initiated by an address transition (and also a data transition, if desired, which is a don't care if an address transition has occurred due to the operation of NAND gate 48). As in the case of a read operation, a low-to-high transition of line TO is generated responsive to the pulse on line ATD in the same manner, with line AD_ having a low pulse thereon which causes NAND gate 52 to issue a high level pulse at its output.

As in the case of a read operation, the low level pulse of line RESET_ causes all of delay gates 66 to be reset in timeout pulse generator 50, causing line TOW_ at the output of inverter 71 to go to a high logic level. Since line WE is high, NAND gate 68 unconditionally presents a high logic level at its output, disabling the read chain of delay gates 66 from affecting the operation of the circuit. The rising edge of line TO also initiates word line selection which, after the desired delay, causes line DWL to make a low-to-high transition.

The transition of line DWL to a high logic level ripples through all of delay gates 66 in the write chain, numbering ten in this embodiment of the invention. As a result, since the number of delay gates 66 in the write chain is five times the number in the read chain, the time required for line TOW_ to go to a low level after line DWL goes high is five times as long as the time required for line TOR_ to go low. After the long delay through the write chain of delay gates 66, line TOW_ makes a high-to-low transition. This causes NAND gate 70 to drive its output high, which drives line PULSE low. The end of line PULSE is communicated to the latch of NAND gates 52 and 62 similarly as in the case of the read operation, causing line TO to return to a low level and disable the active peripheral circuitry in memory 1.

Accordingly, memory 1 constructed according to this embodiment of the invention delays the time-out of line TO for a much longer time in a write cycle than in a read cycle. This is preferred, since a write operation can take much longer than a read, for example on the order of 25 nsec for a write as opposed to 5 nsec for the sense amplifiers 13 to latch and communicate the read data. Accordingly, memory 1 according to the invention allows for the necessary enabling of peripheral circuitry to accomplish a write operation safely, while still taking advantage of the shorter read time necessary, so that unnecessary power dissipation in read cycles is much reduced.

It should also be noted that the circuitry of FIGS. 3 and 4 provides for a fast enabling of peripheral circuitry in memory 1 in the event of a data transition in a long write cycle. This is enabled by NAND gate 48, and line SETPLS. In the event of a write operation which has been completed, and has timed out (i.e., after line TO has returned low as shown in FIG. 6), the input data provided to memory 1 may make a transition. The specifications for modern memories require that the memory write the new data within a short period of time (referred to as the data setup time $t_{ds}$) after the data transition. Accordingly, memory 1 must "wake up", become enabled, and accomplish the write operation in a relatively short period of time. The circuitry of FIGS. 3 and 4 allow for such fast enabling, by quickly generating the high level on line TO.

If line ATD is at a low logic level, indicating that an address transition has not occurred for some time, NOR gate 46 and NAND gate 48 are enabled to respond to the state of line DTD. In the event of a data transition, causing line DTD to go to a high level, NOR gate 46 will cause line RESET_ to go to a low level, which will reset delay gates 66 in timeout pulse generator 50. At the same time, line TO will go to a high level since line SETPLS is driven low; referring to FIG. 4, line PULSE will also go quickly to a high logic level due to line SETPLS going low. Timing out of line TO via operation of timeout pulse generator 50 will occur in the same manner as for the write operation described hereinabove, as line SETPLS will return high upon the end of the DTD pulse, by which time NAND gate 70, shown in FIG. 4, will be issuing a low logic level due to line TOW_ being high. However, the operation of line SETPLS responsive to the data transition allows for rapid enabling of the periphery of memory 1 in the event of a data transition in a long write cycle, such that the write operation can easily be accomplished within the data setup time specification.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A read/write memory, comprising:

a plurality of memory cells;

a write enable input, for receiving a write enable signal indicating whether a write operation or a read operation is to be performed;

a plurality of address terminals, for receiving an address signal;

a decoder for selecting a memory cell according to said address signal;

means for initiating a cycle responsive to receipt of an address signal at said address terminals; and a time-out circuit, for disabling said decoder at a time delayed from initiation of said cycle by said initiating means during which a new valid address signal has not been received, said time-out circuit comprising:

a first delay stage having an input and an output, said output responsive to said input after a first delay time, said input coupled to said initiating means;

a second delay stage having an input and an output, said output responsive to said input after a second delay time, said input coupled to said initiating means;

an output circuit for generating a time-out signal, said output circuit having inputs coupled to said outputs of said first and second delay stages, and having a control input coupled to said write enable input, such that said output circuit generates said time-out signal responsive to said first delay stage in a read operation and responsive to said second delay stage in a write operation.

2. The memory of claim 1, wherein said first delay time is shorter than said second delay time.

3. The memory of claim 1, wherein said initiating means comprises an address transition detection circuit.

4. The memory of claim 3, wherein said initiating means further comprises a data transition detection circuit.

5. A read/write memory, comprising:
a plurality of memory cells;
a write enable input, for receiving a write enable signal indicating whether a write operation or a read operation is to be performed;
a plurality of address terminals, for receiving an address signal;
a decoder for selecting a memory cell according to said address signal;
means for initiating a cycle responsive to receipt of an address signal at said address terminals; and
a time-out circuit, for disabling said decoder at a time delayed from initiation of said cycle by said initiating means, during which a new valid address signal has not been received said time-out circuit comprising:
a first delay stage having an input and an output, said output responsive to said input after a first delay time, said input coupled to said initiating means;
a second delay stage having an input and an output, said output responsive to said input after a second delay time, said input coupled to said initiating means;
an output circuit for generating a time-out signal, said output circuit having inputs coupled to said outputs of said first and second delay stages, and having a control input coupled to said write enable input, such that said output circuit generates said time-out signal responsive to said first delay stage in a read operation and responsive to said second delay stage in a write operation;
wherein said initiating means comprises:
an address transition detection circuit; and
a latch, having a set input coupled to said address transition detection circuit.

6. The memory of claim 5, wherein said latch has a reset input receiving said time-out signal from the output circuit of said time-out circuit.

7. The memory of claim 6, wherein the output of said latch presents an enable signal, coupled to said decoder, for enabling said decoder responsive to said address detection circuit detecting a transition at said address terminals.

8. The memory of claim 7, wherein said enable signal is disabled responsive to said latch receiving said time-out signal at its reset input.

9. A method of operating a memory, comprising the steps of:
initiating a cycle responsive to receipt of an address signal;
receiving a write enable signal indicating whether a read or a write operation is to be performed;
responsive to said write enable signal indicating a read operation and after said initiating step, accessing a memory location corresponding to said address sign for communication of its contents to an output, and disabling portions of said memory upon expiration of a first delay period during which a new cycle is not initiated after said initiating step; and
responsive to said write enable signal indicating a write operation and after said initiating step, accessing a memory cell corresponding to said address signal for communication of a data state thereto, and disabling portions of said memory upon expiration of a second delay period during which a new cycle is not initiated after said initiating step.

10. The method of claim 9, wherein said second delay period is longer than said first delay period.

11. The method of claim 9, wherein said disabling steps disable address decoders used in said accessing steps.

12. A method of operating a memory, comprising the steps of:
initiating a cycle responsive to receipt of an address signal;
receiving a write enable signal indicating whether a read or a write operation is to be performed;
responsive to said write enable signal indicating a read operation and after said initiating step, accessing a memory location corresponding to said address signal for communication of its contents to an output, and disabling portions of said memory upon expiration of a first delay period during which a new cycle is not initiated after said initiating step;
responsive to said write enable signal indicating a write operation and after said initiating step, accessing a memory cell corresponding to said address signal for communication of a data state thereto, and disabling portions of said memory upon expiration of a second delay period after said initiating step;
after said disabling step responsive to said write enable signal indicating a write operation, receiving a transition of input data; and
responsive to said receiving step, initiating a write cycle and accessing a memory cell corresponding to said address signal for communication of a data state thereto.

13. The method of claim 12, further comprising:
after said initiating and accessing steps responsive to said receiving step, disabling portions of said memory upon expiration of said second delay period thereafter.

14. A time-out control circuit for a read/write memory, comprising;
a first delay stage, having an input, having a reset input for receiving a reset signal indicating that a memory cycle is to be initiated, and having an output for presenting a signal responsive to a signal at said input after a first delay period during which no reset signal is received by said first delay stage;

a second delay stage, having an input, having a reset input for receiving a reset signal indicating that a memory cycle is to be initiated, and having an output for presenting a signal responsive to a signal at said input after a second delay period during which no reset signal is received by said second delay stage;

a write enable input for receiving a signal indicating whether a read or a write operation of said memory is to be performed; and means for presenting an enable pulse responsive to receipt of an initiate signal, said presenting means coupled to said first and second delay stages, and coupled to said write enable input, so that the duration of said enable pulse corresponds to said first delay period responsive to said write enable input receiving a signal including a read operation, and so that the duration of said enable pulse corresponds to said second delay period responsive to said write enable input receiving a signal indicating a write operation.

15. The circuit of claim 14, further comprising:

an address transition detection circuit, coupled to address terminals of said memory, for detecting a transition at said address terminals and for generating an address transition signal responsive thereto; and means for generating said initiate signal responsive to said address transition signal;

wherein said reset inputs of said first and second delay stages are coupled to said address transition detection circuit, so that said reset signals indicate that said address transition detection circuit has detected a transition at said address terminals.

16. The circuit of claim 15, further comprising:

a data transition detection circuit, coupled to data terminals of said memory, for detecting a transition at said data terminals and for generating a data transition signal responsive thereto;

and wherein said generating means also generates said initiate signal responsive to said data transition signal;

wherein said reset inputs of said first and second delay stages are coupled to said data transition detection circuit, so that said reset signals also indicate that said data transition detection circuit has detected a transition at said data terminals.

17. A time-out control circuit for a read/write memory, comprising:

a first delay stage, having an input, and having an output for presenting a signal responsive to a signal at said input after a first delay period;

a second delay stage, having an input, and having an output for presenting a signal responsive to a signal at said input after a second delay period;

a write enable input for receiving a signal indicating whether a read or write operation of said memory is to be performed and means for presenting an enable pulse responsive to receipt of an initiate signal, said presenting means coupled to said first and second delay stages, and coupled to said write enable input, so that the duration of said enable pulse corresponds to said first delay period responsive to said write enable input receiving a signal indicating a read operation, and so that the duration of said enable pulse corresponds to said second delay period responsive to said write enable input receiving a signal indicating a write operation;

an address transition detection circuit, coupled to address terminals of said memory, for detecting a transition at said address terminals and for generating an address transition signal responsive thereto;

a data transition detection circuit, coupled to data terminals of said memory, for detecting a transition at said data terminals and for generating a data transition signal responsive thereto; and means for generating said initiate signal responsive to said address transition signal and responsive to said data transition signal;

wherein said generating means generates said initiate signal responsive to said data transition signal in the absence of said address transition signal.

18. A time-out control circuit for a read/write memory, comprising:

a first delay stage, having an input, and having an output for presenting a signal responsive to a signal at said input after a first delay period;

a second delay stage, having an input, and having an output for presenting a signal responsive to a signal at said input after a second delay period;

a write enable input for receiving a signal indicating whether a read or a write operation of said memory is to be performed; and means for presenting an enable pulse responsive to receipt of an initiate signal, said presenting means coupled to said first and second delay stages, and coupled to said write enable input, so that the duration of said enable pulse corresponds to said first delay period responsive to said write enable input receiving a signal indicating a read operation, and so that the duration of said enable pulse corresponds to said second delay period responsive to said write enable input receiving a signal indicating a write operation;

an address transition detection circuit, coupled to address terminals of said memory, for detecting a transition at said address terminals and for generating an address transition signal responsive thereto; and means for generating said initiate signal responsive to said address transition signal, comprising:

logic circuitry having a first input for receiving said initiate signal, having a second input, and having an output at which said enable signal is presented;

a latch, having a first input coupled to the output of said logic circuitry, having a second input, and having an output coupled to said second input of said logic circuitry; and pulse disabling circuitry having inputs coupled to the outputs of said first and second delay stages, having an input coupled to said write enable input for selecting between the outputs of said first and second delay stages, and having an output coupled to the second input of said latch;

wherein said first and second delay stages have inputs for receiving a signal generated responsive to said enable signal;

and wherein said logic circuitry generates said enable signal responsive to said initiate signal until such time as said latch receives a signal from said pulse disabling circuitry indicating that said enable signal is to end.

19. The circuit of claim 15, wherein said first and second delay stages each comprise a plurality of delay gates.

20. The circuit of claim 19, wherein said reset input in said first and second delay stages comprises a reset input in each of said delay gates coupled to said enable input in such a manner that each of said delay gates are reset by said enable signal.

* * * * *